(12) United States Patent
Hoffbauer et al.

(10) Patent No.: US 7,393,762 B2
(45) Date of Patent: Jul. 1, 2008

(54) CHARGE-FREE LOW-TEMPERATURE METHOD OF FORMING THIN FILM-BASED NANOSCALE MATERIALS AND STRUCTURES ON A SUBSTRATE

(75) Inventors: Mark Hoffbauer, Los Alamos, NM (US); Alex Mueller, Santa Fe, NM (US)

(73) Assignee: Los Alamos National Secruity, LLC, Los Alamos, NM (US)

( * ) Notice: Subject to any disclaimer, the term of this patent is extended or adjusted under 35 U.S.C. 154(b) by 0 days.

(21) Appl. No.: 11/603,517

(22) Filed: Nov. 21, 2006

(65) Prior Publication Data
US 2007/0114124 A1  May 24, 2007

Related U.S. Application Data

(60) Provisional application No. 60/738,624, filed on Nov. 21, 2005.

(51) Int. Cl.
*H01L 21/20* (2006.01)
*H01L 21/36* (2006.01)

(52) U.S. Cl. .................. 438/479; 438/41; 438/22; 438/222; 438/226; 438/476; 438/481; 257/E21.001; 257/E21.092; 257/E21.093

(58) Field of Classification Search .................. 438/479
See application file for complete search history.

(56) References Cited

U.S. PATENT DOCUMENTS

| | | | |
|---|---|---|---|
| 4,780,608 A | 10/1988 | Cross et al. | |
| 4,996,187 A * | 2/1991 | Chai | 505/238 |
| 5,271,800 A | 12/1993 | Koontz et al. | |
| 5,858,471 A * | 1/1999 | Ray et al. | 427/524 |
| 6,212,047 B1 * | 4/2001 | Payne et al. | 360/318.1 |
| 6,869,671 B1 * | 3/2005 | Crouse et al. | 428/304.4 |
| 2004/0131718 A1 * | 7/2004 | Chou et al. | 425/385 |
| 2005/0146078 A1 * | 7/2005 | Chou et al. | 264/293 |
| 2006/0044682 A1 * | 3/2006 | Le et al. | 360/126 |

OTHER PUBLICATIONS

Mueller et al., "Multicolor Light-Emitting Diodes Based on Semiconductor Nanocrystals Encapsulated in GaN Charge Injection Layers," Nano Letters, 2005, vol. 5, No. 6, pp. 1039-1044.

* cited by examiner

*Primary Examiner*—Walter Lindsay, Jr.
*Assistant Examiner*—Abdulfattah Mustapha
(74) *Attorney, Agent, or Firm*—Robert P. Santandrea; Juliet A. Jones

(57) ABSTRACT

A method of forming a nanostructure at low temperatures. A substrate that is reactive with one of atomic oxygen and nitrogen is provided. A flux of neutral atoms of at least one of nitrogen and oxygen is generated within a laser-sustained-discharge plasma source and a collimated beam of energetic neutral atoms and molecules is directed from the plasma source onto a surface of the substrate to form the nanostructure. The energetic neutral atoms and molecules in the plasma have an average kinetic energy in a range from about 1 eV to about 5 eV.

27 Claims, 7 Drawing Sheets a b c

US 7,393,762 B2

CHARGE-FREE LOW-TEMPERATURE METHOD OF FORMING THIN FILM-BASED NANOSCALE MATERIALS AND STRUCTURES ON A SUBSTRATE

REFERENCE TO PRIOR APPLICATION

This application claims the benefit of U.S. Provisional Application No. 60/738,624, filed Nov. 21, 2005.

STATEMENT REGARDING FEDERAL RIGHTS

This invention was made with government support under Contract No. DE-AC 52-06 NA 25396, awarded by the U.S. Department of Energy. The government has certain rights in the invention.

BACKGROUND OF INVENTION

The invention relates to the formation of nanostructured materials on a substrate. More particularly, the invention relates to growth of thin films on substrates to form such nanostructures. Even more particularly, the invention relates to growth of films on substrates using energetic neutral atom beam lithography and epitaxy to form such nanostructures.

Growing thin film materials and nanoscale structures for use in semiconducting, mechanical, and optical devices presents considerable challenges, especially when the active regions of such structures approach critical dimensions of only a few nanometers. Problems associated with charge deposition and structural damage from sputtering and related processes pose significant limitations for fabricating nanoscale structures and devices. In addition, the high substrate temperatures typically required for thin film growth often rule out many combinations of materials that could otherwise be used for novel device structures.

Currently, the aggressive growth and processing conditions commonly used in fabricating nanoscale materials and structures often result in substantial damage and compromises the properties of such materials and structures. Moreover, high processing temperatures often preclude the use of certain materials. Therefore, what is needed is a damage-free method for fabricating nanoscale materials and structures. What is also needed is a method of making nanoscale materials and structures that does not require high substrate temperatures.

SUMMARY OF INVENTION

The present invention meets these and other needs by providing a method of fabricating nanoscale materials at low temperatures using energetic neutral atom beam lithography and epitaxy (also referred to herein as "ENABLE"). This technique uses a flux of neutral atoms to form nanostructures, such as thin films, on a substrate.

Accordingly, one aspect of the invention is to provide a method of forming at least one nanoscale material on a substrate. The at least one nanoscale material comprises at least one of an oxide and a nitride. The method comprises the steps of: providing the substrate; providing a flux of at least one element to a surface of the substrate, wherein the at least one element is an element other than oxygen and nitrogen; introducing at least one of nitrogen and oxygen into a plasma within a plasma source, wherein the plasma dissociates, heats, and energizes the at least one of nitrogen and oxygen; extracting a collimated flux of energetic neutral atoms and molecules of at least one of nitrogen and oxygen from the plasma source; and directing the collimated flux from the plasma source onto the surface of the substrate, wherein the at least one element reacts with the energetic neutral atoms to form the at least one nanoscale material.

Another aspect of the invention is to provide a method of forming a thin film on a substrate. The thin film comprises at least one of an oxide and a nitride. The method comprises the steps of: providing the substrate; providing a flux of at least one element to a surface of the substrate, wherein the at least one element is selected from the group consisting of silicon, germanium, gallium, indium, aluminum, zinc, magnesium, manganese, cobalt, tin, iron, and titanium; introducing at least one of nitrogen and oxygen into a plasma within a plasma source, wherein the plasma dissociates, heats, and energizes the at least one of nitrogen and oxygen; extracting a collimated flux of energetic neutral atoms and molecules of at least one of nitrogen and oxygen from the plasma source; and directing the collimated flux from the plasma source onto the surface of the substrate, wherein the at least one element reacts with the energetic neutral atoms to form the thin film on the surface.

Still another aspect of the invention is to provide a nanoscale material disposed on a substrate. The nanoscale material comprises at least one of an oxide and a nitride and is formed by: providing the substrate; providing a flux of at least one element to a surface of a substrate, wherein the at least one element is an element other than oxygen and nitrogen; introducing at least one of nitrogen and oxygen into a plasma within a plasma source, wherein the plasma dissociates, heats, and energizes the at least one of nitrogen and oxygen; extracting a collimated flux of energetic neutral atoms and molecules of at least one of nitrogen and oxygen from the plasma source; and directing the collimated flux from the plasma source onto the surface of the substrate, wherein the at least one element reacts with the energetic neutral atoms to form the nanoscale material on the surface.

These and other aspects, advantages, and salient features of the present invention will become apparent from the following detailed description, the accompanying drawings, and the appended claims.

DETAILED DESCRIPTION

Figure 1:
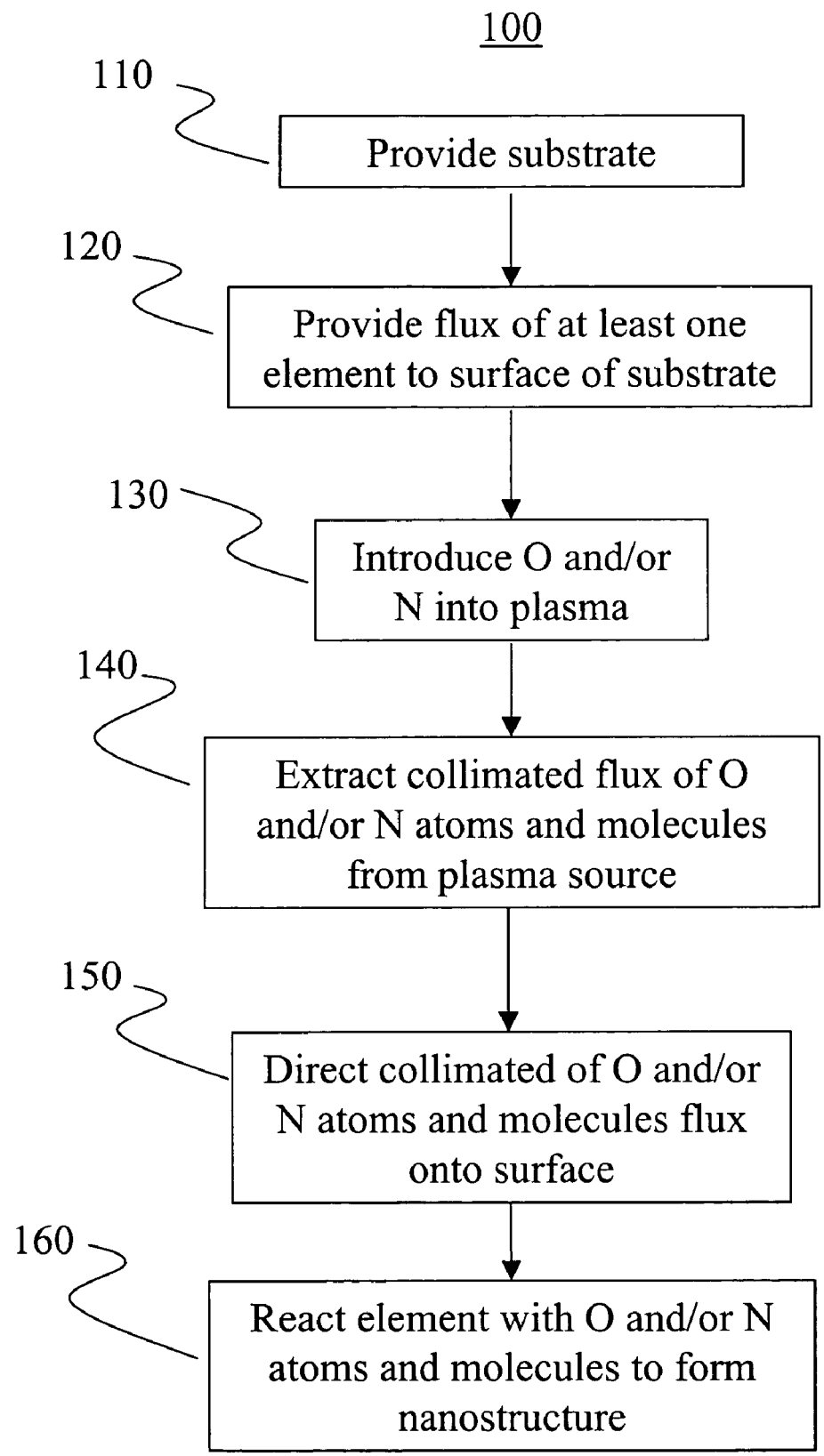
FIG. 1 is a flow chart for a method of making a nanoscale material on a substrate.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing a particular embodiment of the invention and are not intended to limit the invention thereto. Turning to FIG. 1, a flow chart for a method of making at least one nanoscale material on a substrate is shown. As used herein, the term "nanoscale material" is understood to include any material, structure, or feature that is formed by addition of a material to the substrate, wherein such features have at least one dimension (e.g., length, diameter, width, or depth) of less than about 100 nm. Examples of such nanoscale materials include, but are not limited to, thin films, wire, rods, sheets, ribbons, and the like. In one embodiment, individual nanoscale materials have features with at least one dimension of at least 20 nm. In another embodiment, features as small as 1 nm may be achieved.

In method 100, the at least one nanoscale material is formed by providing materials—such as either metals or semiconducting materials—directly onto the substrate in the presence of the collimated flux of energetic neutral nitrogen or oxygen atoms to form either oxide or nitride materials. Such metals and semiconducting materials include, but are not limited to, silicon, germanium, gallium, indium, aluminum, zinc, titanium, magnesium, manganese, tin, cobalt, iron, and the like.

In Step 110, a substrate is provided. For thin film growth, the substrate is usually a crystalline material upon which a thin film of the nanoscale material is epitaxially grown. Substrate crystallinity usually determines the quality and crystallinity of the nitride or oxide thin film, which in turn determine at least one of the electrical properties, optical properties, and general quality of the thin film. Typical crystalline substrates include, but are not limited to, sapphire ($Al_2O_3$), silicon, zinc oxide, silicon carbide, and the like. The substrate crystalline lattice match to the thin film grown on the substrate can determine the final quality of the thin film. The thin film of nanoscale material is commonly grown on either the (0001) crystallographic face of sapphire, the (0001) face of silicon carbide, the (0001) face of zinc oxide, or the (111) face of silicon.

Use of the ENABLE technique allows thin films of nanoscale materials such as GaN to be grown on substrates at low temperatures. Thus, in another embodiment, the substrate is a polymeric substrate. Non-limiting examples of such polymeric substrates include, but are not limited to, polyimides, polymethyl methacrylate (PMMA), Shipley SU-8 photoresist, polycarbonates, perfluorinated cyclobutane (PFCB), and combinations thereof. Alternatively, the substrate may comprise highly oriented pyrolytic carbon (HOPC), glassy carbon, diamond, and combinations thereof.

A flux of at least one element in gaseous form is provided to a surface of the substrate in Step 120. The flux of the at least one element may be generated, for example, by either e-beam evaporation or thermal evaporation. In Step 130, neutral atoms and molecules of least one of nitrogen and oxygen are introduced into a plasma within a plasma source. A collimated flux or beam of energetic neutral atoms and molecules are then extracted from the plasma source (Step 140) and directed onto the surface of the substrate (Step 150). The flux of at least one element and the collimated flux of energetic neutral atoms and molecules react at or near the surface to form the nanoscale material (Step 160). The energetic neutral atoms and molecules in the plasma have an average kinetic energy in a range from about 1 eV to about 5 eV. In one embodiment, the collimated flux is at least $10^{14}$ neutral atoms and molecules/$cm^2$·sec. In another embodiment, the collimated flux is in a range from about $10^{14}$ neutral atoms and molecules/$cm^2$ sec to about $10^{18}$ neutral atoms and molecules/$cm^2$·sec.

Figure 2:
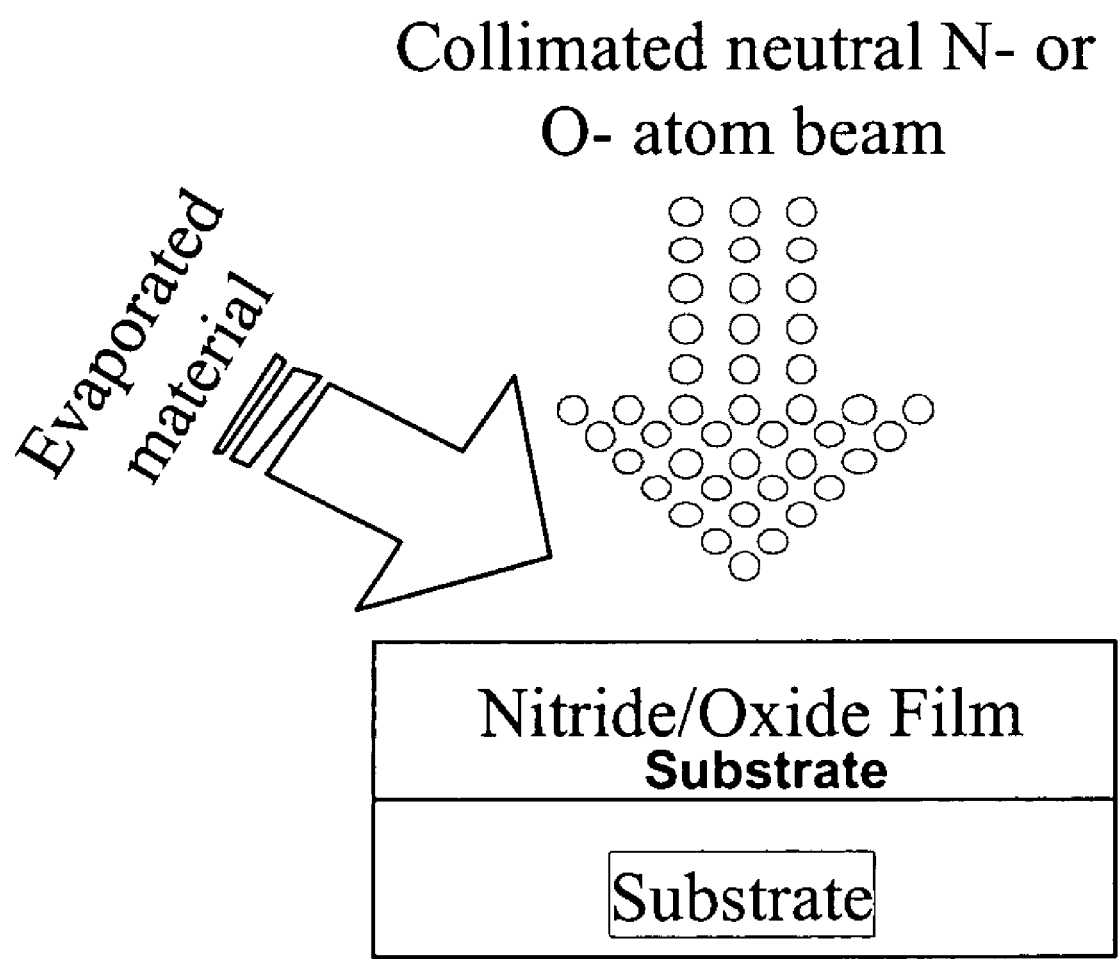
FIG. 2 is a schematic representation of the application of energetic neutral atom beam lithography and epitaxy (ENABLE) to form oxide or nitride thin film materials.

Due to their energy, charge neutrality, and chemical specificity, the use of neutral atomic species with energies on the order of chemical bond strengths (i.e., a few electron volts (eVs)) offers many advantages over more conventional approaches for materials processing involving thin film growth and etching. The high kinetic energy of the atoms and molecules in the collimated flux circumvent the need for thermal activation of the substrate, and allow the nanoscale materials and structures to be formed at lower substrate temperatures. These advantages in turn permit the use of some substrates, such as the polymeric substrates described herein, which would otherwise sustain substantial damage due to high processing temperatures. In one embodiment, the substrate is heated up to about 800° C. during processing. In a second embodiment, the substrate is heated to about 500° C. In a third embodiment, the substrate is heated to a temperature in a range from about 20° C. to about 100° C. during processing. In yet another embodiment, the substrate is maintained at near ambient (i.e., about 30° C.) temperature. To achieve high etch or growth rates over large areas, a high flux of atomic species is required. Energetic Neutral Atom Beam Lithography and Epitaxy (also referred to herein as "ENABLE"), schematically illustrated in FIG. 2, is capable of providing the necessary flux of atomic species. ENABLE utilizes a neutral atomic beam source that produces energetic species (O or N atoms) with kinetic energies in a range from about 0.5 eV to about 5 eV and a collimated flux of about $10^{17}$ atoms/$cm^2$ sec (which is equivalent to about 100 monolayers/sec) over an area of approximately 20 $cm^2$.

The generation of the collimated flux of energetic neutral atoms and molecules by ENABLE is described in U.S. Pat. No. 4,780,608 by Jon B. Cross et al., entitled "Laser Sustained Discharge Nozzle Apparatus for the Production of an Intense Beam of High Kinetic Energy Atomic Species," issued Oct. 25, 1988; U.S. Pat. No. 5,271,800 by Steven L. Koontz et al., entitled "Method for Anisotropic Etching in the Manufacture of Semiconductor Devices," issued Dec. 21, 1993; and U.S. Pat. No. 6,68,967 by Mark A. Hoffbauer et al., entitled "Reduction of Surface Leakage Current by Surface Passivation of CdZnTe and Related Materials using Hyperthermal Oxygen Atoms," issued Jan. 2, 2001; and U.S. patent application Ser. No. 10/102,303 by A. Mueller et al., entitled "Colloidal Quantum Dot Light Emitting Diodes," filed Mar. 25, 2004, the contents of which are incorporated by reference herein in their entirety.

Nanostructures etched into polymer films on crystalline substrates can be used as templates for growing thin films nanoscale materials where the template determines their nanoscale dimensions. A method of etching such polymer films using ENABLE is described in the U.S. patent application Ser. No. 60/738,634, entitled "Charge-Free Method of Forming Nanostructures on a Substrate," by Mark A. Hoffbauer et al., filed on Nov. 21, 2006, the contents of which are incorporated by reference herein in their entirety. In order to be suitable for ENABLE etching, polymer substrate surfaces must first be patterned with a mask material that does not react with energetic O-atoms to form volatile reaction products. A variety of techniques known in the art, including photolithography, e-beani lithography, nanosphere lithography, and the like may be used for masking polymeric substrates. When the sample is exposed to the incident collimated beam of atomic oxygen, the unprotected areas are anisotropically etched away, leaving the underlying masked polymer substrate intact.

While etching represents a top-down approach for nanofabrication, the invention offers the capability for bottom-up assembly of nanoscale materials in the same system. Metals or semiconductors such as, but not limited to, silicon, germanium, gallium, indium, aluminum, zinc, magnesium, titanium, manganese, cobalt, tin, iron, and the like, may be evaporated directly onto a substrate in the presence of energetic atomic oxygen or nitrogen species to form oxide or nitride materials, as illustrated in FIG. 2. Since the energy of the atomic species can overcome thermal activation barriers associated with oxidation and nitridation reactions, the elevated substrate temperatures often required for growing thin film materials by other methods (e.g., metal organic chemical vapor deposition (MOCVD), molecular beam epitaxy (MBE), and atomic layer deposition (ALD)) can be reduced or eliminated. As a result, high-quality nitride or oxide films can be grown at relatively low substrate temperatures even on very delicate materials such as polymers.

Figure 3:
FIG. 3 is a series of scanning electron microscopy (SEM) images showing: a) a template polymer substrate; b) a stoichiometric aluminum nitride (AlN) film grown onto the patterned substrate shown in FIG. 3a by evaporating aluminum metal with simultaneous exposure to a N-atom beam flux; and c) the resulting template-defined array of AlN wires, formed after dissolving the polymer template.
Figure 3:
Figure 3:

The invention allows nitride or other thin film materials to be directly grown onto polymeric films to form templated nanostructures. For example, FIG. 3b is a scanning electron microscopy (SEM) image of a 700 nm thick stoichiometric aluminum nitride (AlN) film that was grown at a rate of about 10 nm/min onto the patterned substrate shown in FIG. 3a by evaporating Al metal with simultaneous exposure to a N-atom beam flux having an energy of about 0.8 eV. The resulting template-defined array of AlN wires shown in FIG. 3c was formed after dissolving and removing the polymer template. The low-temperature fabrication approach of the invention may be used to produce 2- and 3-dimensional nanostructures and devices with multiple functionalities.

The formation of highly crystalline gallium nitride (GaN) films by the methods described herein serves to illustrate the features and advantages of the invention. While the formation of GaN is described, it is understood that nanoscale material and structures comprising other nitrides, oxides, or particular crystallographic structures thereof may be formed using these methods. For example, other Group III nitrides such as aluminum nitride (AlN) and indium nitride (InN), silicon nitride ($Si_3N_4$), and oxides, such as aluminum oxide ($Al_2O_3$), titanium oxide ($TiO_2$), zinc oxide (ZnO), and silica ($SiO_2$) may be formed using these methods.

Figure 4:
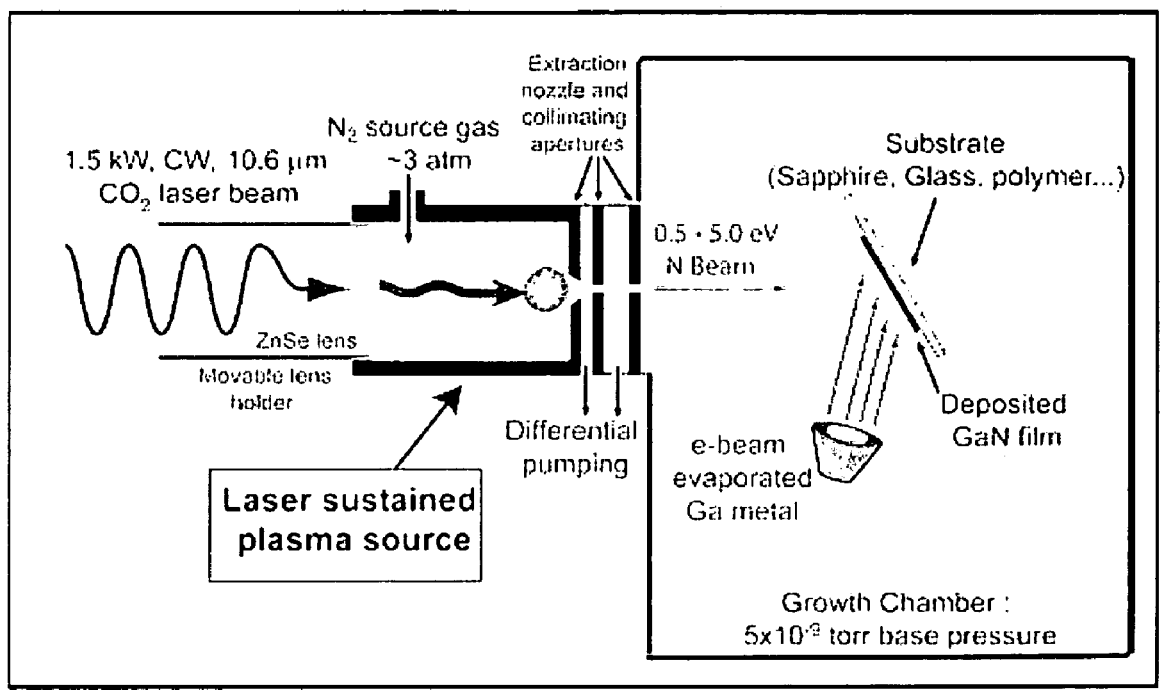
FIG. 4 is a schematic representation of the formation of a continuous beam of energetic neutral nitrogen atoms created by extracting the constituents of a laser sustained N-plasma discharge through a supersonic nozzle.

As illustrated in FIG. 4, a continuous beam of energetic neutral nitrogen or oxygen atoms is created by extracting the constituents of a laser sustained N- or O-based plasma discharge through a supersonic nozzle. The effective source temperature and final kinetic energy of the extracted species may be adjusted by translating the lens forward (i.e., toward the nozzle) to move the laser focus—and thus the plasma discharge—into the nozzle orifice. Very efficient ion-electron recombination in the constricted nozzle and in the high-density supersonic expansion region yields an energetic neutral beam flux consisting primarily of (i.e., often greater than 98%) atomic species. The atom beam velocity may be increased by seeding the plasma with a lower molecular weight gas such as, for example, helium or the like, by varying the plasma position relative to the nozzle, and/or varying the pressure within the laser-sustained plasma region. Typically, nitrogen atoms having a mean kinetic energy of about 1.0 eV to about 2.0 eV or oxygen atoms having a mean kinetic energy of about 2.0 eV to about 3.0 eV are produced. Energy distribution ($\Delta E/E$) of the atomic species is typically about 30%. Subsequent collimation of the atom beam by a series of apertures results in a neutral beam flux in a range from about $10^{14}$ neutral atoms and molecules/$cm^2$ ·sec to about $10^{18}$ neutral atoms and molecules/$cm^2$·sec. In one embodiment, the neutral beam flux is about $1 \times 10^{17}$ neutral atoms and molecules/$cm^2$ ·sec. The neutral beam flux is uniform over an area of approximately 15 $cm^2$ at a distance 50 cm from the source nozzle with a divergence of less than 2°. The atomic beam velocity, energy, composition, and flux are directly measured using time-of-flight mass spectroscopy.

Along with energetic nitrogen atoms, a collimated flux of gallium metal is simultaneously supplied to the substrate surface to initiate GaN film growth. In one embodiment, gallium metal is provided by e-beam or thermal evaporation at rates ranging from about 0.1 μm/hr to 4.0 μm/hr. Evaporation rates of up to 10 μm/hr may be achieved. The GaN growth rate is limited by the Ga evaporation rate, since a large excess of active N is supplied to the surface. The growth chamber is maintained at a base pressure of about $5 \times 10^{-9}$ torr or less, while the background pressure, which consists mostly of background $N_2$ and He, reaches about $2 \times 10^{-6}$ torr during film growth.

For the results described herein, as-received c-axis oriented sapphire (0001) substrate pieces, measuring about 1 $cm^2$, were moved into vacuum, heated to the GaN growth temperatures, and exposed to the atomic N beam with kinetic energies ranging from 0.8 eV to 2.0 eV for 5 minutes to clean and pre-nitride the substrate surface. Gallium nitride film growth at rate of approximately 1 μm/hr was initiated by opening a shutter to deliver the Ga flux.

Figure 5:
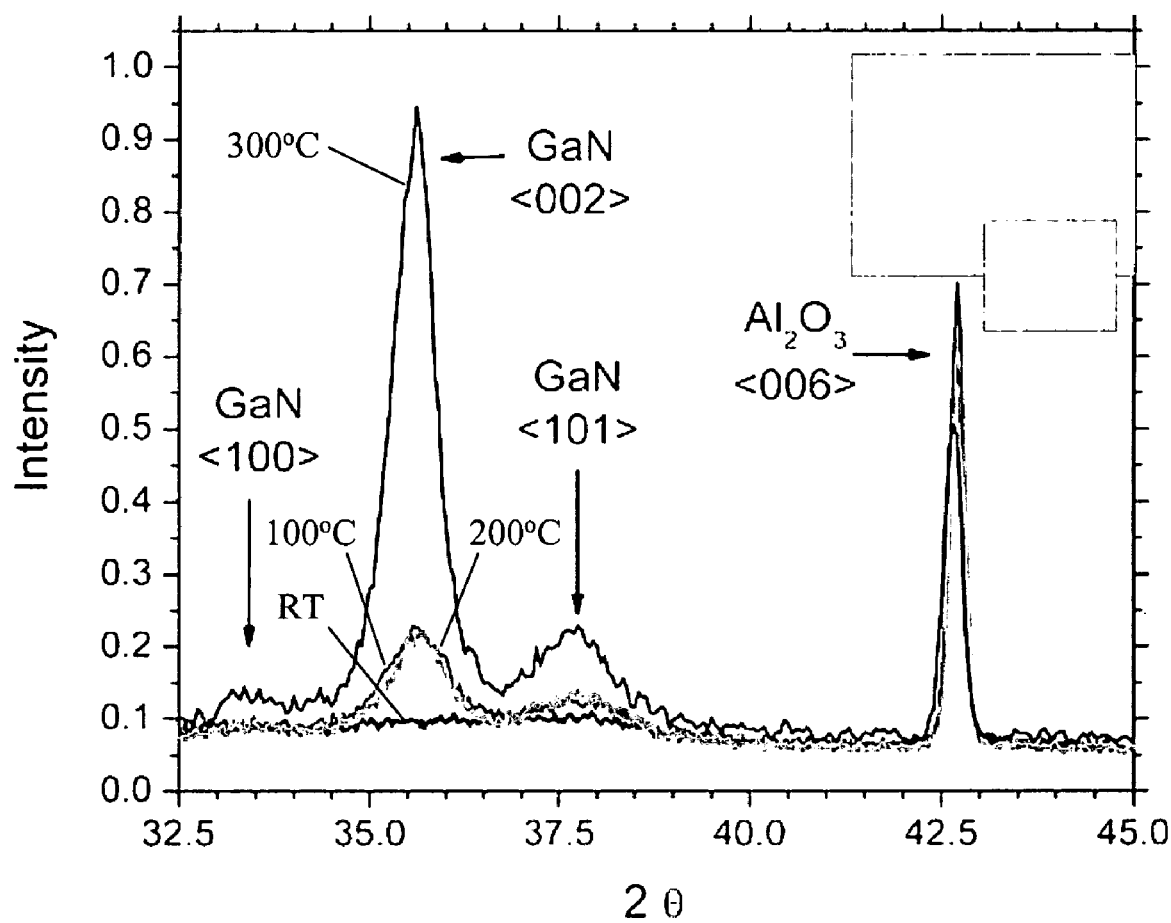
FIG. 5 is a series of θ-2θ x-ray diffraction scans of GaN films grown on bare sapphire at ambient, 100° C., 200° C. and 300° C. substrate temperatures.

The θ-2θ x-ray diffraction (XRD) scans of GaN films grown on bare sapphire at ambient, 100° C., 200° C. and 300° C. substrate temperatures are shown in FIG. 5. At ambient temperature (labeled "RT" in FIG. 5), GaN growth results in an amorphous film, whereas clear evidence for polycrystalline GaN films is observed at growth temperatures above 100° C. GaN films grown at 100° C. and 200° C. show similar degrees of crystallinity. A pronounced increase in the crystallographic alignment of the GaN film is observed in XRD scans obtained for films grown at 300° C., indicating that about 80% of the film is c-axis oriented.

Figure 6:
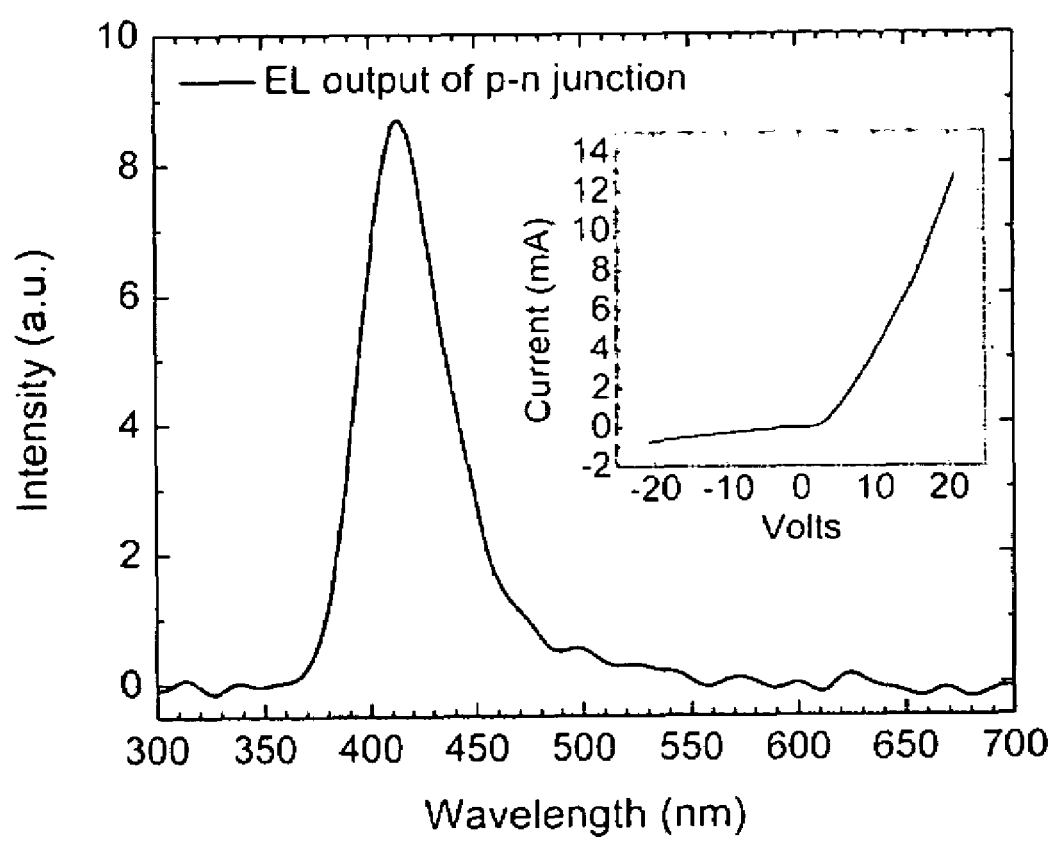
FIG. 6 is a plot of electro-luminescent (EL) output for a GaN film grown by a method of the present invention and current-voltage (I-V) properties of a p-n junction prepared by growing gallium nitride (GaN) using the ENABLE method at a substrate temperature of 300° C. (inset)

The electrical properties of the low-temperature GaN films also improve as growth temperature increases. GaN films grown at temperatures below 200° C. are highly insulating. Resistivity decreases sharply at growth temperatures above 20020 C., resulting in n-type GaN films with an intrinsic carrier density ranging from $2.1 \times 10^{17}$ to $4.7 \times 10^{18}$ carriers/$cm^3$. The inset in FIG. 6 shows the current-voltage (I-V) properties of a p-n junction prepared by growing 1 μm of ENABLE-grown GaN at a substrate temperature of 300° C. and a growth rate of about 1 μm/hr on top of a MOCVD grown p(Mg)-GaN substrate. I-V scans of the p-n junction show diodic behavior with forward conduction commencing at a bias of 3.0±0.1 V, accompanied by the room-temperature electro-luminescent (EL) output shown in FIG. 6. The spectrum shows that the EL emission is centered at 415 nm (2.98 eV, FWHM=41 nm), matching the energy gap between the Mg dopant level of the p-GaN and the conduction band edge of the ENABLE n-GaN.

Figure 7:
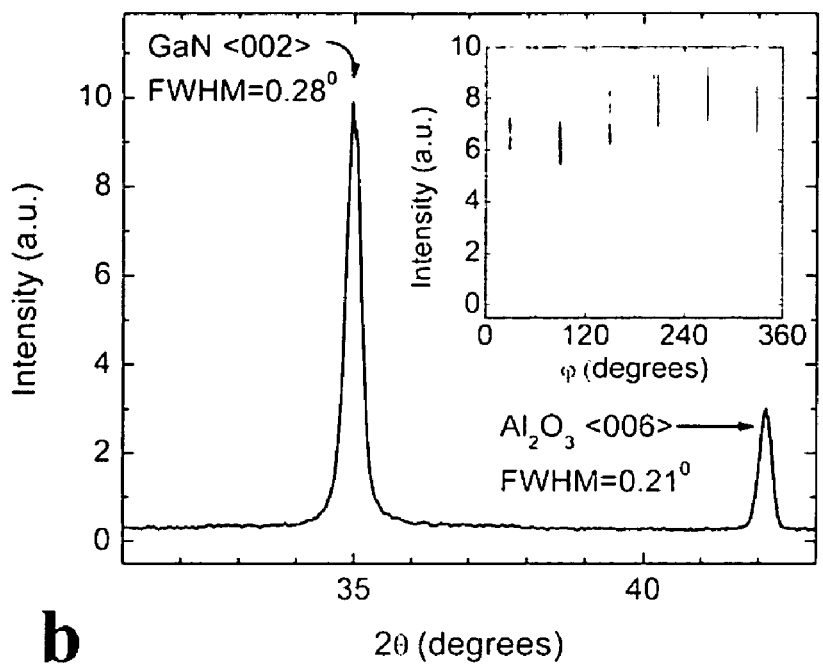
FIG. 7 is: a) a θ-2θ x-ray diffraction scan obtained for a GaN film grown at 500° C. on a sapphire substrate without a buffer layer; and b) a high-resolution cross-sectional transmission electron microscopy image of a GaN film grown at 500° C. on a sapphire substrate.
Figure 7:
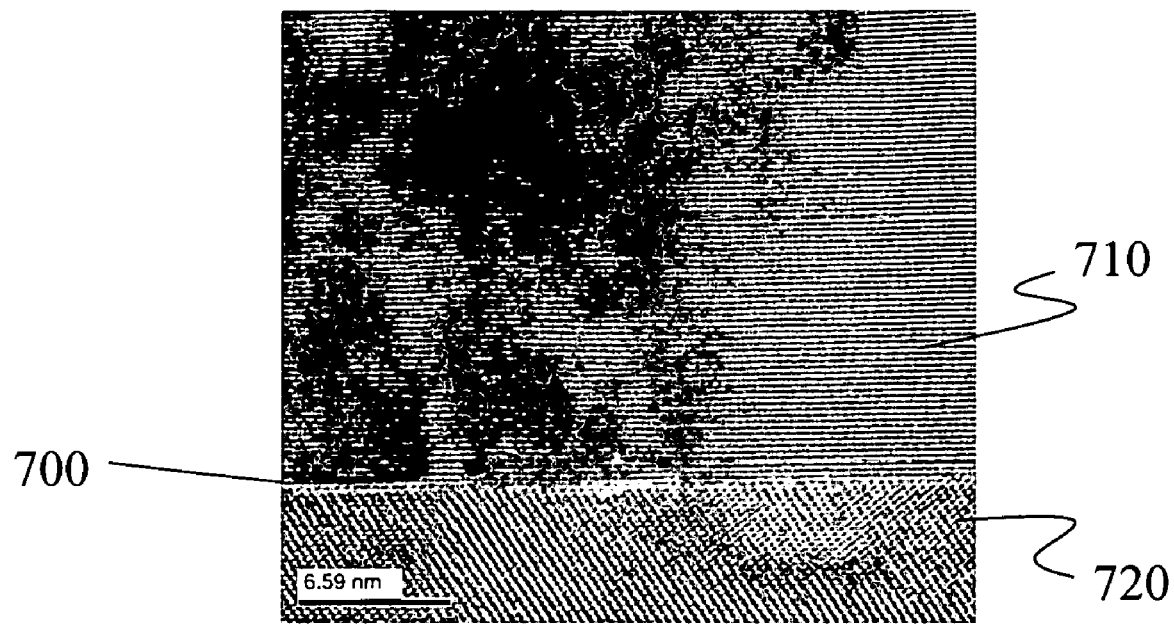

Increasing the GaN film growth temperature to 500° C. significantly increases film crystallinity. FIG. 7a shows the θ-2θ XRD scan of a 400 nm thick GaN film grown at 500° C. on a bare c-plane (0001) sapphire substrate without a buffer layer. The resulting GaN film was found to be exclusively c-axis oriented. The FWHM of the <002> GaN peak measures 0.28°, with the single crystal sapphire substrate <006> peak FWHM of 0.21°, representing the instrumental contribution to peak broadening. A shift of 0.037° is observed in the position of the GaN <002> peak due to the compressive strain resulting from the 13.8% lattice mismatch of the GaN film and the sapphire substrate. A pole figure XRD scan of the <101> GaN Bragg peak shown in the inset of FIG. 7a indicates excellent epitaxial alignment between the lattice mismatched substrate and the nitride film with a mosaic spread of 2.8° to 3.0°. For comparison, mosaic spreads for a GaN film grown on a buffer layer at 1050° C. by MOCVD are typically between 2.8° and 3.2°.

The high-resolution cross-sectional transmission electron microscopy (TEM) image shown in FIG. 7b for a GaN film 710 grown on a sapphire substrate 720 at 500° C. shows an atomically abrupt GaN film/sapphire interface 700. Similar results have been reported for GaN grown by plasma assisted molecular beam epitaxy (MBE) at 800° C. with extensive substrate preparation. A larger field image of the same film shows a columnar microstructure with grain sizes of about 50 nm. This microstructure likely has a detrimental effect on electron mobilities in GaN films due to carrier scattering at defect sites. The maximum mobility measured at room temperature was about 9.7 cm/V sec. Significantly higher mobilities for doped GaN films grown by the ENABLE method may be achieved when lattice mismatch is mitigated using either buffer layers or better lattice-matched substrates.

The invention also includes a thin film having at least one nanostructure disposed on a substrate formed by the methods described herein. In one embodiment, the nanostructure is formed by providing a substrate; providing a flux of at least one element to a surface of a substrate, wherein the at least one element is an element other than nitrogen or oxygen (in one embodiment, the element is selected from the group consisting of silicon, germanium, gallium, indium, aluminum, zinc, magnesium, manganese, tin, iron, and titanium); introducing at least one of nitrogen and oxygen into a plasma within a plasma source, wherein the plasma heats, dissociates, and energizes at least one of nitrogen and oxygen; extracting a collimated flux of energetic neutral atoms and molecules of at least one of nitrogen and oxygen from the plasma source; and directing the collimated flux from the plasma source onto the surface of the substrate, wherein the at least one element reacts with the energetic neutral atoms to form the nanostructure on the surface. Examples of such nanostructures are shown in FIGS. 3b and 3c. FIG. 3b is a SEM image of an aluminum nitride thin film grown onto a template (FIG. 3a) formed by O-atom etching of a masked polyimide using ENABLE, whereas FIG. 3c is a SEM image of AlN nanowires formed from the thin film shown in FIG. 3b by removing the template.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method of forming at least one nanoscale material on a substrate, the at least one nanoscale material comprising at least one of an oxide and a nitride, the method comprising the steps of:
   a. providing the substrate;
   b. providing a flux of at least one element to a surface of the substrate, wherein the at least one element is an element other than oxygen and nitrogen;
   c. introducing at least one of nitrogen and oxygen into a plasma within a plasma source, wherein the plasma dissociates, heats, and energizes the at least one of nitrogen and oxygen;
   d. extracting a collimated flux of energetic neutral atoms and molecules of at least one of nitrogen and oxygen from the plasma source; and
   c. directing the collimated flux from the plasma source onto the surface of the substrate, where the at least one element reacts with the energetic neutral atoms to form the at least one nanoscale material; and,
   f. wherein the neutral atoms and molecules in the collimated flux have an average kinetic energy in a range from about 0.5 eV to about 5 eV.

2. The method according to claim 1, wherein the at least one element is selected from the group consisting of silicon, germanium, gallium, indium, aluminum, zinc, magnesium, manganese, cobalt, tin, iron, and titanium.

3. The method according to claim 1, wherein the substrate is one of silicon, sapphire, silicon carbide, and zinc oxide.

4. The method according to claim 3, wherein the nanoscale material is epitaxially deposited on the substrate.

5. The method according to claim 1, wherein the substrate is one of a polymeric substrate, highly oriented pyrolytic carbon, glassy carbon, and diamond.

6. The method according to claim 5, wherein the polymeric substrate is templated.

7. The method according to claim 5, wherein the polymeric substrate is one of a polymide, polymethyl methacrylate, Shipley SU-8, a polycarbonate, perfluorinated cyclobutane, and combinations thereof.

8. The method according to claim 1, wherein the collimated flux of energetic neutral atoms and molecules is a flux of at least $10^{14}$ neutral atoms and molecules/cm$^2$·sec.

9. The method according to claim 8, wherein the collimated flux of energetic neutral atoms and molecules is a flux in a range from about $10^{14}$ neutral atoms and molecules/cm$^2$·sec to about $10^{18}$ neutral atoms and molecules/cm$^2$·sec.

10. The method according to claim 1, wherein the substrate is heated to a temperature of up to about 500 C. during formation of the nanoscale material.

11. A method of forming at least one nanoscale material on a substrate, the at least one nanoscale material comprising at least one of an oxide and a nitride, the method comprising the steps of:
   a. providing the substrate;
   b. providing a flux of at least one element to a surface of the substrate, wherein the at least one element is an element other than oxygen and nitrogen;
   c. introducing at least one of nitrogen and oxygen into a plasma within a plasma source, wherein the plasma dissociates, heats, and energizes the at least one of nitrogen and oxygen;
   d. extracting a collimated flux of energetic neutral atoms and molecules of at least one of nitrogen and oxygen from the plasma source; and e. directing the collimated flux from the plasma source onto the surface of the substrate, where the at least one element reacts with the energetic neutral atoms to form the at least one nanoscale material; and, f. wherein the substrate is heated to a temperature in a range from about 20° C. to about 100° C. during formation of the nanoscale material.

12. The method according to claim 1, wherein the nanoscale material comprises at least one of aluminum nitride, gallium nitride, indium nitride, silicon nitride, aluminum oxide, titanium oxide, zinc oxide, and silica.

13. The method according to claim 1, wherein the step of providing the flux of the at least one element comprises providing a flux of the at least one element by one of e-beam evaporation and thermal evaporation.

14. The method according to claim 1, wherein the at least one nanoscale material comprises one of a thin film, a wire, and a rod.

15. The method according to claim 1, wherein the step of extracting the collimated flux of energetic neutral atoms and molecules of at least one of nitrogen and oxygen from the plasma source comprises extracting the collimated flux of energetic neutral atoms and molecules by Energetic Neutral Atom Beam Lithography and Epitaxy.

16. A method of forming a thin film on a substrate, the thin film comprising at least one of an oxide and a nitride, the method comprising the steps of:

a. providing the substrate;

b. providing a flux of at least one element to a surface of the substrate, wherein the at least one element is selected from the group consisting of silicon, germanium, gallium, indium, aluminum, zinc, magnesium, manganese, cobalt, tin, iron, and titanium;

c. introducing at least one of nitrogen and oxygen into a plasma within a plasma source, wherein the plasma dissociates, heats, and energizes the at least one of nitrogen and oxygen;

d. extracting a collimated flux of energetic neutral atoms and molecules of at least one of nitrogen and oxygen from the plasma source; and e. directing the collimated flux from the plasma source onto the surface of the substrate, where the at least one element reacts with the energetic neutral atoms to form the thin film on the surface; and, f. wherein the neutral atoms and molecules in the collimated flux have an average kinetic energy in a range from about 0.5 eV to about 5 eV.

17. The method according to claim 16, wherein the substrate is one of silicon, sapphire, silicon carbide, and zinc oxide.

18. The method according to claim 16, wherein the thin film is epitaxially deposited on the substrate.

19. The method according to claim 16, wherein the substrate is one of a polymeric substrate, highly oriented pyrolytic carbon, glassy carbon, and diamond.

20. The method according to claim 19, wherein the polymeric substrate is one of a polyimide, polymethyl methacrylate, Shipley SU-8, a polycarbonate, perfluorinated cyclobutane, and combinations thereof.

21. The method according to claim 16, wherein the collimated flux of energetic neutral atoms and molecules is a flux of at least $10^{14}$ neutral atoms and molecules/cm$^2$·sec.

22. The method according to claim 21, wherein the collimated flux of energetic neutral atoms and molecules is a flux in a range from about $10^{14}$ neutral atoms and molecules/cm$^2$·to about $10^{18}$ neutral atoms and molecules/cm$^2$·sec.

23. The method according to claim 16, wherein the substrate is heated to a temperature of up to about 500° C. during formation of the nanoscale material.

24. A method of forming a thin film on a substrate, the thin film comprising at least one of an oxide and a nitride, the method comprising the steps of:

a. providing the substrate;

b. providing a flux of at least one element to a surface of the substrate, wherein the at least one element is selected from the group consisting of silicon, germanium, gallium, indium, aluminum, zinc, magnesium, manganese, cobalt, tin, iron, and titanium;

c. introducing at least one of nitrogen and oxygen into a plasma within a plasma source, wherein the plasma dissociates, heats, and energizes the at least one of nitrogen and oxygen;

d. extracting a collimated flux of energetic neutral atoms and molecules of at least one of nitrogen and oxygen from the plasma source; and e. directing the collimated flux from the plasma source onto the surface of the substrate, where the at least one element reacts with the energetic neutral atoms to form the thin film on the surface; and, f. wherein the substrate is heated to a temperature in a range from about 20° C. to about 100° C. during formation of the nanoscale material.

25. The method according to claim 16, wherein the thin film comprises at least one of aluminum nitride, gallium nitride, indium nitride, silicon nitride, aluminum oxide, titanium oxide, zinc oxide, and silica.

26. The method according to claim 16, wherein the step of providing the flux of the at least one element comprises providing a flux of the at least one element by one of e-beam evaporation and thermal evaporation.

27. The method according to claim 16, wherein the step of extracting the collimated flux of energetic neutral atoms and molecules of at least one of nitrogen and oxygen from the plasma source comprises extracting the collimated flux of energetic neutral atoms and molecules by Energetic Neutral Atom Beam Lithography and Epitaxy.

* * * * *